United States Patent [19]

Ohshima et al.

[11] Patent Number: 4,864,164
[45] Date of Patent: Sep. 5, 1989

[54] INTEGRATED CIRCUIT WITH SWITCHING NOISE REDUCTION BY FEEDBACK

[75] Inventors: Shigeo Ohshima, Tokyo; Youichi Suzuki; Makoto Segawa, both of Kanagawa, all of Japan

[73] Assignee: Kabushiki Kaisha Toshiba, Kanagawa, Japan

[21] Appl. No.: 254,915

[22] Filed: Oct. 7, 1988

[30] Foreign Application Priority Data

Oct. 28, 1987 [JP] Japan ................ 62-272111

[51] Int. Cl.$^4$ ........................................ H03K 17/16
[52] U.S. Cl. ...................... 307/443; 307/451; 307/554; 307/246; 307/290
[58] Field of Search ............ 307/200 B, 443, 448, 307/451, 546, 553–555, 562, 246, 573, 579, 575–577, 584–585, 290, 296 R

[56] References Cited

U.S. PATENT DOCUMENTS

| 4,609,834 | 9/1986 | Gal | 307/443 |
| 4,613,771 | 9/1986 | Gal | 307/443 |
| 4,656,370 | 4/1987 | Kanuma | 307/443 X |
| 4,740,717 | 4/1988 | Fletcher et al. | 307/451 X |
| 4,754,170 | 6/1988 | Toda et al. | 307/443 |
| 4,761,572 | 8/1988 | Tanizawa | 307/557 X |
| 4,777,389 | 10/1988 | Wu et al. | 307/475 X |
| 4,782,252 | 11/1988 | Levy et al. | 307/443 X |
| 4,783,601 | 11/1988 | Hartgring et al. | 307/246 |
| 4,785,201 | 11/1988 | Martinez | 307/451 X |
| 4,797,579 | 1/1989 | Lewis | 307/263 X |

FOREIGN PATENT DOCUMENTS

| 0244121 | 10/1986 | Japan | 307/448 |
| 1023659 | 6/1983 | U.S.S.R. | 307/448 |

Primary Examiner—David Hudspeth
Attorney, Agent, or Firm—Finnegan, Henderson, Farabow, Garrett & Dunner

[57] ABSTRACT

An integrated circuit includes an input buffer circuit and an output buffer circuit. The source voltage to the input buffer circuit and the output buffer circuit are supplied through bonding pads formed independently on a semiconductor chip, and electrically connected to a source potential lead pin. The input node of the input buffer circuit is coupled to the source potential of the output buffer circuit with a capacitor.

10 Claims, 2 Drawing Sheets

INTEGRATED CIRCUIT WITH SWITCHING NOISE REDUCTION BY FEEDBACK

BACKGROUND OF THE INVENTION

1. Field of the Invention

This invention concerns an integrated circuit used in a high speed semiconductor memory in which noise or voltage fluctuation occurs during the reading operation. More particularly, this invention concerns an improvement of an input buffer circuit and an output circuit of an integrated circuit which eliminates the influence of the noise associated with the output circuit on the input buffer circuit which eliminates the influence of the noise associated with the output circuit on the input buffer circuit.

2. Description of the Prior Art

Generally, an integrated circuit is formed in a semiconductor chip, and electrically connected to inner leads provides in a package by bonding wires. Those bonding wires have some resistance and inductance. Thus, a voltage drop occurs due to the resistance, and a counterelectromotive force is generated due to the inductance in response to an operating current.

FIG. 1 is a diagram of a conventional integrated circuit which includes an input buffer circuit and an output circuit used in a memory device. Semiconductor integrated circuit chip 3 comprises an input buffer circuit 1 and an output buffer circuit 2.

The input buffer circuit 1 is a CMOS Schmitt trigger type, and includes N type MOS transistors T3, T4 and T5, and a P type MOS transistor T2. The gate electrodes of the transistors T3, T4 and T5 are connected to a bonding pad 5 formed on the chip. The source electrode of the transistor T2 is supplied with a power source voltage VDD, and the source electrode of the transistor T5 is connected to a bonding pad 4 formed on the chip through a wiring 200 supplied with a reference voltage VSS. An output of the CMOS Schmitt trigger circuit, namely a connection of the drain electrodes of the transistors T2 and T3 is connected to the input of an inverter circuit 6. An output Ain of the inverter circuit 6 is used as, e.g., an address signal or a clock signal, and has the same phase and same level with respect to the input signal A. A resistance RS and a parasitic capacitance CS exist between the bonding pad 5 and the input buffer circuit 1.

Reference I/O and $\overline{I/O}$ represents data buses formed in the chip, and are connected to a memory circuit (not shown) and also are connected to a control circuit 7 of the output buffer circuit 2. T1 and T7 are drive transistors, and are supplied with an output of the control circuit 7 at the respective gate electrodes thereof. An output, namely a conection of the drive transistors T7 and T1, is connected to a load capacitor CL through an output node N3. A ground level 100 is located at external of the integrated circuit. The bonding pad 4 is connected to a lead pin N4 on the package by a bonding wire having an inductance l and a resistance r. LEX shows an inductance which exists in an external wiring between the lead in N4 and ground level 100.

In this circuit, at the read-out of a data "0", the charge stored in the load capacitor CL is rapidly discharged to ground through the drive transistor T1, the wiring 200, the resistance r, and the inductance l and LEX. This discharge causes a noise or rapid voltage fluctuation. Namely, to read out the data "0", the potential level of the gate electrode of the drive transistor T1 becomes high, and the transistor T1 switches to an ON state. In this state, a discharging current Iout flows to ground and causes an increase of potential level at pad 4 due to the voltage drop at the resistor and the product of the dIout/dt and the inductance of (l+LEX) with respect to the ground level.

Signal A is an input signal from external of the chip supplied by an input signal supplying circuit (not shown) of low output impedance. Thus, signal A is only slightly influenced, if at all, by the noise or the fluctuation of the reference voltage VSS. Therefore, the gate to source voltage Vgs of transistor T5 fluctuates due to the fluctuation of the reference voltage VSS which appears on the source electrode of transistor T5.

The relationship between the operating signals is illustrated in FIG. 2. In FIG. 2, VS represents a reference voltage which appears at rhe source electrode of the transistor T5. N2, N3 and Ain represent operating signals at the gate electrode of the transistor T1, at the node N3 and the output of the inverter 6, respectively. Due to the rise of the reference voltage VSS, the potential of the input signal A drops, relatively. Thus, the gate to source voltage VGS may go lower than the logical low leverl VIL (the level to cause transistor T2 of the input buffer circuit to be conductive) of the input buffer circuit. When the gate to source voltage VGS becomes lower than the logical low level VIL, the level of the signal Ain becomes a low level, and an undesirable fluctuation 11 occurs. This fluctuation sometimes causes an error in operation of the memory device. To remove the fluctuation, it is necessary to set the logical high level VIH (the level to cause transistors T3 and T5 of the input buffer circuit to be conductive) sufficiently high. However, by setting the VIH high, the margin for the VIH is decreased.

SUMMARY OF THE INVENTION

Therefore, an object of this invention is to prevent an error operation of the memory device due to the noise or voltage fluctuation during the reading operation. Another object of this invention is to prevent the decrease of the margin for the VIH and the VIL.

To achieve the above object, this invention provides an integrated circuit formed on a semiconductor chip, comprising: input circuit means for receiving an input signal, having an input node; output circuit means for outputting an output signal; first terminal means of said input circuit for receiving a first reference voltage which fluctuates in response to said output signal of said output circuit means; second terminal means of said output circuit means for receiving a second reference voltage which fluctuates in response to said output signal of said output circuit means; and means for coupling the second reference voltage to the input node of the input circuit means for compensating a voltage fluctuation between the input node of the input circuit means and the first terminal means.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. Of the drawings.

DETAILED DESCRIPTION OF THE INVENTION

Figure 1:
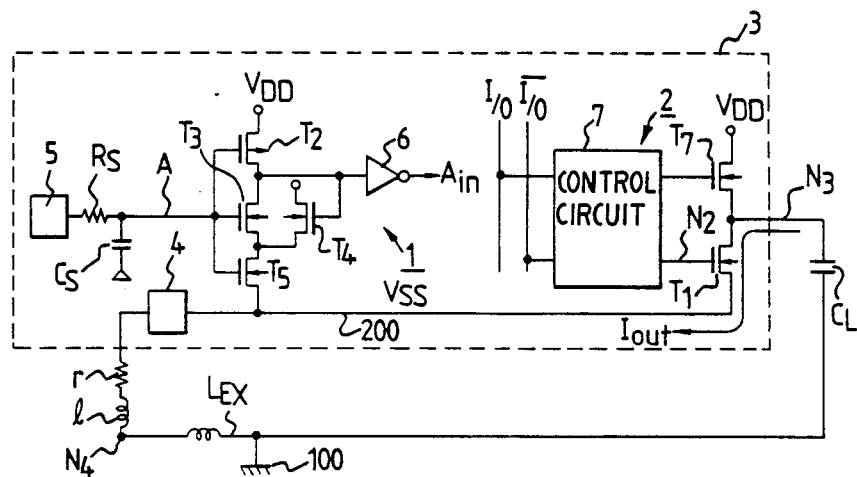
FIG. 1 is a circuit diagram of a conventional integrated circuit.
Figure 2:
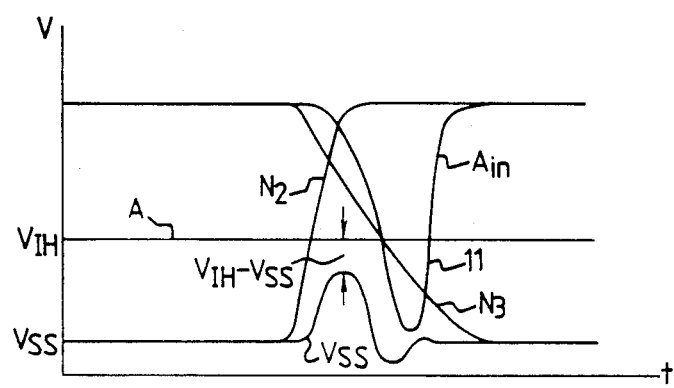
FIG. 2 shows the operating signal of the conventional integrated circuit of FIG. 1.
Figure 3:
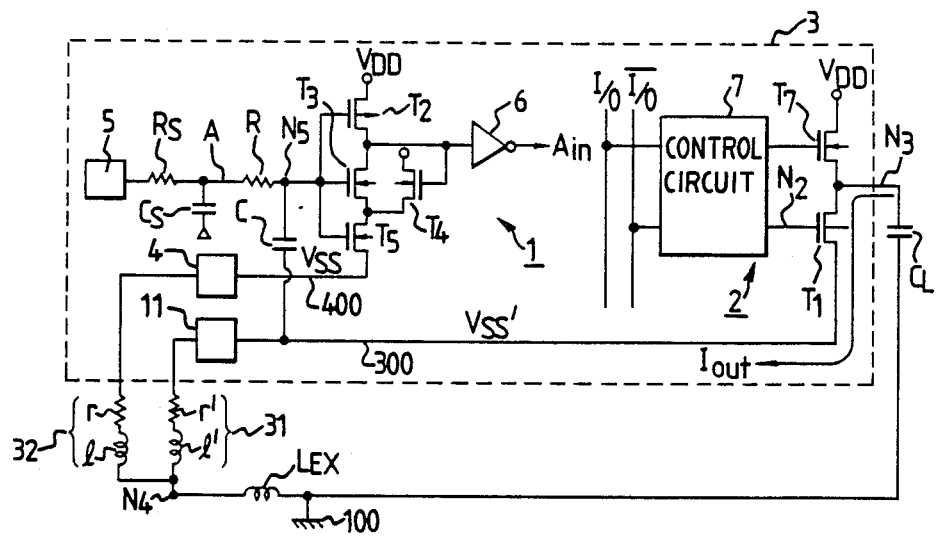
FIG. 3 is a circuit diagram of the preferred embodiment of this invention.

Referring now to FIG. 3, there is illustrated a circuit diagram of an embodiment of this invention. In this circuit diagram, the parts corresponding to those of FIG. 1 are identified by the same numerals and references.

In the present invention, there is provided input circuit means 1 for receiving an input signal at pad 5, and having an input node N5. In the preferred embodiment of FIG. 3, the input circuit means is an input buffer circuit 1. The input buffer circuit 1 comprises an CMOS Schmitt trigger circuit including a P type MOS transistor T2 and N type MOS transistors T3, T4 and T5, and an inverter circuit 6. The input buffer circuit 5 further includes a resistor R of several KΩs, and a resistance RS and a parasitic capacitance CS which exist between the input node N5 and the pad 5 formed on a semiconductor chip.

In this invention, there is provided an output circuit means 2 for outputting an output signal at a node N3. In the preferred embodiment of FIG. 3, the output circuit means is an output buffer circuit 2. The output buffer circuit 2 includes a control circuit 7, N type MOS transistors T1 and T7. The gate electrodes of the transistors T1 and T7 are connected to the control circuit 7, and the drain electrodes thereof are connected in common and are connected to the node N3. The source electrode of transistor T7 is supplied with a power source voltage VDD.

In this invention, there is provided first terminal means 4 and 32 for receiving a first reference voltage VSS which fluctuates in response to the output signal of the output circuit means. In the preferred embodiment of FIG. 3, the first terminal means includes a first bonding pad 4 formed on a semiconductor chip, and a resistance r and an inductance l which exist in a bonding wire 32. The bonding wire 32 connects the bonding pad 4 to an inner lead pin N4 on a package (not shown). The source electrode of transistor T5 is connected to the pad 4.

In this invention, there is provided second terminal means 11 and 31 for receiving a second reference voltage VSS' which fluctuates in response to the output signal of the output circuit means. In the preferred embodiment of FIG. 3, the second terminal means includes a second bonding pad 11 formed on the semiconductor chip, and a resistance r' and an inductance l' which exist in a bonding wire 31. The bonding wire 31 connects the pad 11 to the inner lead pin N4 on the package. The source electrode of transistor T1 is connected to the pad 11.

In this invention, there is also provided coupling means C for coupling the second reference voltage VSS' to the input node N5 of the input circuit means. In the preferred embodiment of FIG. 3, the coupling means includes a capacitor C.

In this circuit, the discharge current Iout flows to ground level 100 through the resistance r' and the inductance l' and LEX. However, the Iout does not flow through the wiring 32. Thus, the second reference voltage VSS' at the pad 11 becomes higher than the first reference voltage VSS at the pad 4 in the amount of (r'·Iout+l'·dIout/dt). In other words, it is possible to provide first and second reference voltages which fluctuate with different amount each other in response to the output signal by forming the first and the second terminal means independently. The change of the second reference voltage VSS' due to the output current Iout is transferred to the input node N5 by the capacitor C. By setting the time constant C.R of the resistor R and the capacitor C larger than the noise width, and by setting the ratio of the coupling capacitance C to MS capacitances of the transistors T2, T3 and T5 sufficiently large, the gate to source voltage VGS of the transistor T5 is expressed as follows when the input signal A is inputted at level VIH.

$$VGS = VIH + Vss' - Vss \quad (1)$$

As explained previously, the VSS' is higher than the VSS, the VGS becomes higher than the VIH. Thus, the level of the input signal A is maintained higher than the VIH, and the margin for the VIH is rather increased.

Namely, by supplying the second reference voltage VSS' which fluctuates more than the first reference voltage VSS to the input node N5, the level of the input signal A is maintained, and the margin for the VIH is rather increased. Furthermore, by setting the time constant C.R larger than the noise width, the VGS is maintained higher than the VIH during the duration of the noise. Thus, the undesirable fluctuation in the signal Ain is prevented.

Figure 4:
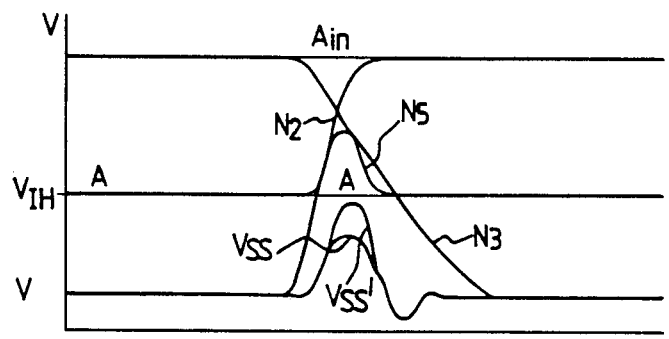
FIG. 4 shows the operating signals of the preferred embodiment of this invention.

The operating signals of the integrated circuit of FIG. 3 are shown in FIG. 4. In FIG. 4, VSS and VSS' represent signals or reference voltages which appear at the source electrodes of the transistors T1 and T2. N3, N4 and N5 represent signals at the gate electrode of transistor T1, at the output node N3 and at the input node N5 of the input buffer circuit 1. respectively. As shown in FIG. 4, the potential at the input node N5 is raised due to the rise of the reference voltage VSS' because of the coupling of the input node N5 to the reference voltage VSS' by the capacitor C. The reference voltage VSS is also raised due to the external inductance LEX. After the rise of the potential VSS', a fall of the VSS occurs as a reaction of the rise. However, the input node N5 is coupled to the reference voltage VSS' by the capacitor C, the potential level of the node N5 is also lowered in accordance with the reference voltage VSS'. Thus, the voltage fluctuation between the input node N5 and the first reference voltage VSS is compensated, and the logical low level VIL is also maintained to prevent an error operation of the memory device. Therefore, the fall of the margin for the VIL is prevented.

Figure 5:
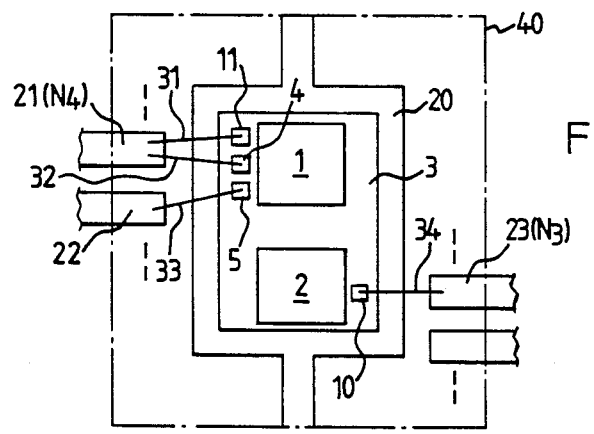
FIG. 5 is a schematic plan view of a semiconductor device in which an integrated circuit of an embodiment of this invention is formed.

The integrated circuit of FIG. 3 is constructed like shown in FIG. 5. FIG. 5 is a schematic plan view of a semiconductor device in which the integrated circuit of FIG. 3 is formed. In the drawing, a numeral 3 is a semiconductor chip, wherein an input buffer circuit 1 and an output buffer circuit 2 are formed. Other parts, e.g., a memory section and a control circuit, are omitted in the drawing. Numerals 4, 5, 10 and 11 designate bonding pads formed on the semiconductor chip.

The semiconductor chip 3 is mounted on a die pad portion 20 of a lead frame. Numerals 21, 22 and 23 designate inner leads which are electrically connected to the corresponding bonding pad with bonding wires 31, 32, 33 and 34. These elements are packaged with, e.g., a plastic material (not shown). A numeral 40 designates an outline of the package. The inner lead 21 corresponds to the lead pin N4, and the inner lead 23 corresponds to the output node N3 in FIG. 3.

The pads 4 and 11 are connected to the inner lead 21 by bonding wires 31 and 32. The resistance and the inductance of respective bonding wires 31 and 32 are expressed as r', l' and r, l in FIG. 3. The bonding wire 34 connected between the inner lead 23 and the output bonding pad 10 has some resistance and inductance. However, as the effect of the resistance and the inductance of the bonding wire 34 has no relation to this invention, those are omitted in FIG. 3. It should be noted that the total number of the lead pins is not changed as the first and the second bonding pads 4 and 11 are commonly connected to the lead pin 21, even if the pads 4 and 11 are formed independently.

In the prescribed embodiment, the Schmitt trigger type input buffer circuit is used. However, other type of the input buffer circuit, such as CMOS inverter circuit, an NMOS inverter circuit, can be used for the input buffer circuit.

The present invention has been described with respect to a specific embodiment. However, other embodiments based on the principles of the present invention should be obvious to those of ordinary skill in the art. Such embodiments are intended to be covered by the claims.

What is claimed is:

1. An integrated circuit formed on a semiconductor chip, comprising:
   input circuit means for receiving an input signal, having an input node;
   output circuit means for outputting an output signal;
   first terminal means of said input circuit for receiving a first reference voltage which fluctuates in response to said output signal of said output circuit means;
   second terminal means of said output circuit means for receiving a second reference voltage which fluctuates in response to said output signal of said output circuit means; and
   means for coupling the second reference voltage to the input node of the input circuit means for compensating a voltage fluctuation between the input node of the input circuit means and the first terminal means.

2. The integrated circuit of claim 1, wherein the coupling means includes a capacitor.

3. The integrated circuit means of claim 2, further comprising an input terminal means for receiving an input signal, and a resistive means for connecting the input node of the input circuit means to the input terminal means.

4. The integrated circuit of claim 1, wherein the input circuit means includes a Schmitt trigger circuit.

5. The integrated circuit of claim 4, wherein the output circuit means includes a MOS transistor having a source electrode connected to the second terminal means.

6. The integrated circuit according to claim 1, wherein the first terminal means includes a first bonding pad formed on the semiconductor chip, and the second terminal means includes a second bonding pad formed on the semiconductor chip.

7. An integrated circuit for supplying an output signal to a load capacitor, comprising:
   first pad means for receiving first reference voltage which fluctuates in response to the output signal;
   second pad means for receiving second reference voltage which fluctuates in response to the output signal;
   input circuit means being supplied with the first reference voltage, having an input node;
   output circuit being supplied with the second reference voltage; and
   means for coupling the second reference voltage to the input node for compensating a voltage fluctuation between the input node and the first terminal means.

8. The integrated circuit of claim 7, wherein the input circuit means comprising:
   first MOS transistor of first conductivity type having a source electrode supplied with a power source voltage, and a drain electrode;
   second MOS transistor of second conductivity type, having a source electrode connected to the first terminal means and a drain electrode connected to the drain electrode of the first MOS transistor.

9. The integrated circuit of claim 8, wherein the output circuit means comprises third MOS transistor of the second conductivity type, having a source electrode connected to the second terminal means, and a drain electrode connected to the load capacitor.

10. THe integrated circuit of claim 9, further comprising:
   third terminal means for receiving an input signal; and
   resistive means for connecting the input node of the input circuit means to the third terminal means.

* * * * *